US009362374B2

(12) United States Patent
Tan et al.

(10) Patent No.: US 9,362,374 B2
(45) Date of Patent: Jun. 7, 2016

(54) SIMPLE AND COST-FREE MTP STRUCTURE

(71) Applicant: GLOBALFOUNDRIES Singapore Pte. Ltd., Singapore (SG)

(72) Inventors: Shyue Seng Tan, Singapore (SG); Eng Huat Toh, Singapore (SG); Jeoung Mo Koo, Singapore (SG); Danny Shum, Poughkeepsie, NY (US); Elgin Kiok Boone Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/253,878

(22) Filed: Apr. 16, 2014

(65) Prior Publication Data

US 2015/0001608 A1    Jan. 1, 2015

Related U.S. Application Data

(60) Provisional application No. 61/839,879, filed on Jun. 27, 2013.

(51) Int. Cl.
| | | |
|---|---|---|
| H01L 29/788 | (2006.01) | |
| H01L 29/423 | (2006.01) | |
| H01L 27/115 | (2006.01) | |
| G11C 16/04 | (2006.01) | |

(52) U.S. Cl.
CPC ...... *H01L 29/42324* (2013.01); *G11C 16/0425* (2013.01); *H01L 27/11558* (2013.01); *H01L 29/7881* (2013.01); *H01L 29/7883* (2013.01); *H01L 29/7885* (2013.01)

(58) Field of Classification Search
CPC .............. H01L 29/42324; H01L 29/7881; H01L 29/7883; H01L 29/7885; H01L 27/11558; G11C 16/0425
See application file for complete search history.

(56) References Cited

U.S. PATENT DOCUMENTS

| | | |
|---|---|---|
| 5,841,165 A | 11/1998 | Chang et al. |
| 6,044,018 A | 3/2000 | Sung et al. |
| 6,130,840 A | 10/2000 | Bergemont et al. |
| 6,166,954 A | 12/2000 | Chern |
| 6,211,548 B1 | 4/2001 | Ma |
| 6,452,835 B1 | 9/2002 | Diorio et al. |
| 6,711,064 B2 | 3/2004 | Hsu et al. |
| 6,740,556 B1 | 5/2004 | Hsu et al. |
| 6,812,083 B2 | 11/2004 | Shen et al. |
| 6,819,594 B2 | 11/2004 | Lee et al. |

(Continued)

OTHER PUBLICATIONS

L. Chang et al., Non-volatile memory device with true CMOS compatibility, Electronics Letters, Aug. 19, 1999, vol. 35, No. 17.

(Continued)

*Primary Examiner* — Long Pham
(74) *Attorney, Agent, or Firm* — Horizon IP Pte. Ltd.

(57) ABSTRACT

Embodiments of a simple and cost-free multi-time programmable (MTP) structure for non-volatile memory cells are presented. A non-volatile MTP memory cell includes a substrate, first and second wells disposed in the substrate, a first transistor having a select gate and a second transistor having a floating gate adjacent one another and disposed over the second well and sharing a diffusion region. The memory cell further includes a control gate disposed over the first well. The control gate is coupled to the floating gate and the control and floating gates include the same gate layer extending across the first and the second wells.

22 Claims, 20 Drawing Sheets

(56) References Cited

U.S. PATENT DOCUMENTS

| | | | |
|---|---|---|---|
| 6,914,825 | B2 | 7/2005 | Hsu et al. |
| 6,920,067 | B2 | 7/2005 | Hsu et al. |
| 7,209,392 | B2 | 4/2007 | Chen et al. |
| 7,391,647 | B2 | 6/2008 | Fang et al. |
| 7,417,897 | B2 | 8/2008 | Chen et al. |
| 7,423,903 | B2 | 9/2008 | Lin et al. |
| 7,474,568 | B2 | 1/2009 | Horch |
| 7,508,719 | B2 | 3/2009 | Horch |
| 8,218,369 | B2 | 7/2012 | Lin et al. |
| 8,305,808 | B2 | 11/2012 | Lin et al. |
| 8,320,180 | B2 | 11/2012 | Kalnitsky |
| 8,355,282 | B2 | 1/2013 | Ching et al. |
| 8,384,155 | B2 | 2/2013 | Lin et al. |
| 2007/0241392 | A1 | 10/2007 | Lin et al. |
| 2008/0035973 | A1 | 2/2008 | Lin et al. |
| 2009/0267127 | A1* | 10/2009 | Chen et al. .................. 257/314 |
| 2010/0238738 | A1 | 9/2010 | Yoo et al. |
| 2011/0233643 | A1 | 9/2011 | Chang |
| 2012/0236635 | A1 | 9/2012 | Ching et al. |
| 2012/0236646 | A1 | 9/2012 | Hsu et al. |
| 2013/0020626 | A1 | 1/2013 | Tan et al. |
| 2013/0093012 | A1 | 4/2013 | Zhang et al. |
| 2014/0015047 | A1 | 1/2014 | Ng et al. |
| 2015/0036437 | A1 | 2/2015 | Li et al. |

OTHER PUBLICATIONS

Yanjun Ma et al., Reliability of pFET EEPROM with 70-Å Tunnel Oxide Manufactured in Generic Logic CMOS Processes, IEEE Transactions on Device and Materials Reliability, Sep. 2004, vol. 4, No. 3.

Albert Bergemont, Current limitations of floating gate NVM and new alternatives, Maxim Integrated Products, Apr. 10, 2007, EDS Meeting.

* cited by examiner

500a

500b

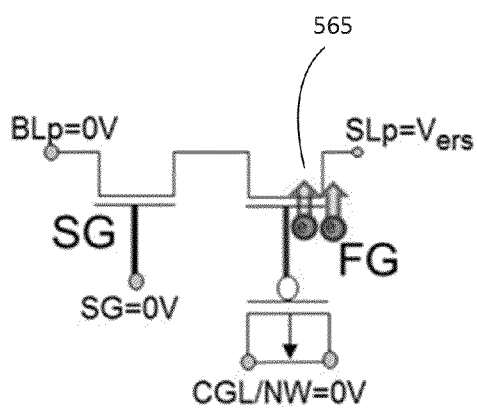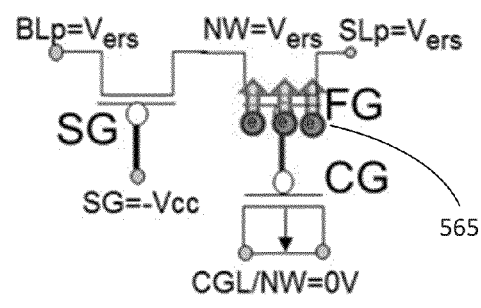
600c
600d
Fig. 6c
Fig. 6d

600e

900c

(12) United States Patent
US 9,362,374 B2

SIMPLE AND COST-FREE MTP STRUCTURE

CROSS-REFERENCE TO RELATED APPLICATION

This application claims the priority benefit of U.S. Provisional Application Ser. No. 61/839,879, filed on Jun. 27, 2013, which is herein incorporated by reference in its entirety.

BACKGROUND

Multi-time programmable (MTP) memories have been recently introduced for beneficial use in a number of applications where customization is required for both digital and analog designs. These applications include data encryption, reference trimming, manufacturing identification (ID), security ID, and many other applications. Incorporating MTP memories nonetheless also typically comes at the expense of some additional processing steps. Some of the existing approaches to constructing MTP memories tend to suffer from slow access time, smaller coupling ratio and/or large cell size. Some of the existing approaches utilize band-to-band tunneling hot hole (BBHH) for erasing operation, but requires high junction band voltage and more process steps. Other existing approaches need additional coupling erase gate and coupling capacitor, and hence also require more area.

Therefore, there is a need for a simple and cost-free MTP structure to create non-volatile memory cells with the standard complementary metal-oxide-semiconductor (CMOS) platform.

SUMMARY

Embodiments generally relate to a simple and cost-free MTP structure. In one embodiment, a non-volatile MTP memory cell includes a substrate, first and second wells disposed in the substrate. The memory cell includes a first transistor having a select gate and a second transistor having a floating gate adjacent one another and disposed over the second well and sharing a diffusion region. The memory cell further includes a control gate disposed over the first well. The control gate is coupled to the floating gate and the control and floating gates include the same gate layer extending across the first and the second wells.

In another embodiment, a non-volatile MTP memory cell includes a substrate, a device well disposed in the substrate and a transistor having a floating gate disposed over the device well. The memory cell also includes a capacitor having a metal-insulator-metal (MIM) capacitor being coupled to the floating gate. The capacitor is disposed in metal levels above the floating gate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which:

FIGS. 6a-6e show various operations of a memory cell.

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

Figure 1:
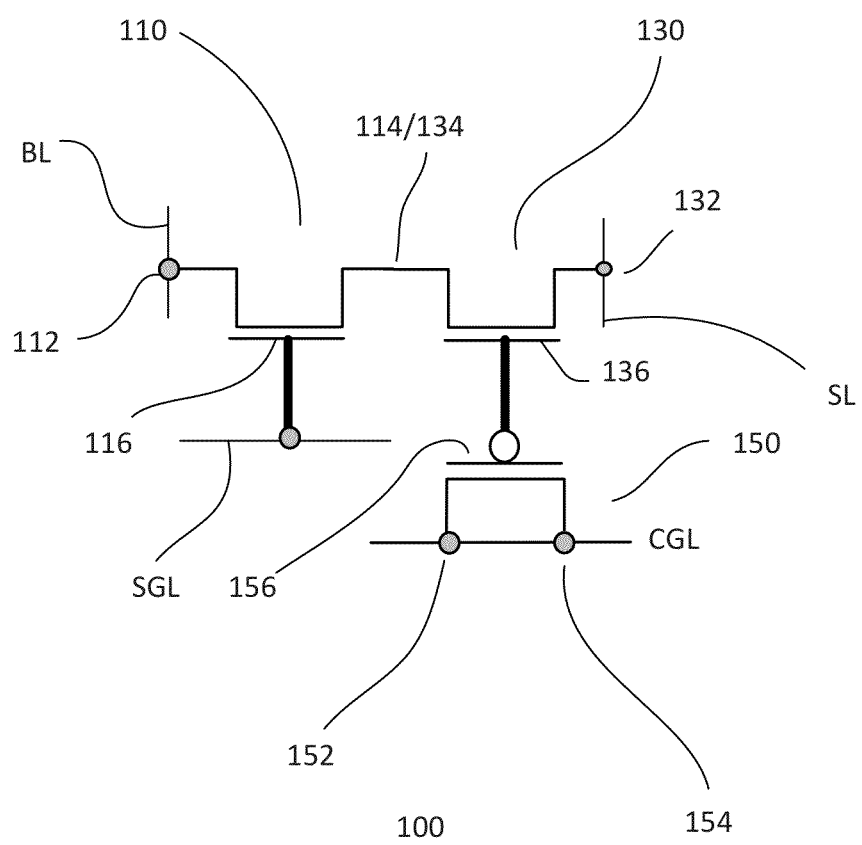
FIG. 1 shows a schematic diagram of a memory cell.

FIG. 1 shows a schematic diagram of an embodiment of a memory cell 100. The memory cell, in one embodiment, is a non-volatile MTP memory cell 100. As shown in FIG. 1, memory cell 100 includes a first transistor 110, a second transistor 130 and a control capacitor 150. In one embodiment, memory cell 100 may be a MTP memory cell, e.g., a non-volatile (NV) MTP memory cell. The first and second transistors are, for example, metal oxide semiconductor (MOS) transistors. A transistor includes a gate between first and second diffusion regions. A gate includes a gate electrode and a gate dielectric. The first transistor serves as an access transistor 110 while the second transistor serves as a storage transistor 130. For example, the access transistor 110 includes a first access diffusion region 112, a second access diffusion region 114 and an access gate 116; the storage transistor 130 includes a first storage diffusion region 132, a second storage diffusion region 134 and a storage gate 136. The access gate 116 may be referred to as a select gate and the storage gate 136 may be referred to as a floating gate.

In one embodiment, the control capacitor is a MOS transistor. For example, the control capacitor includes a control gate 156 with a control gate electrode and a control gate dielectric. First and second control diffusion regions 152 and 154 are disposed adjacent to sides of the control gate. The control capacitor includes first and second plates separated by a dielectric layer. The control gate electrode serves as one plate of the capacitor while a capacitor well serves as the other capacitor plate. The control diffusion regions serve as contacts to the well capacitor plate. The control capacitor isolates the storage gate, making it a floating gate.

The access and storage transistors are coupled in series. For example, the second access diffusion region and second storage diffusion region form a common diffusion region of the transistors. As for the control gate and storage gate electrodes, they are commonly coupled. By commonly coupling the control and storage gates 156 and 136, a floating storage gate is produced. In one embodiment, a common gate electrode is provided for the control and storage gates. Other configurations of the storage and control gates may also be useful.

The first access diffusion region 112 of first or access transistor 110 is coupled to a bit line (BL) of the memory device. The first storage diffusion region 132 of second or storage transistor 130 is coupled to a source line (SL) of the memory device. The access gate 116 of the first transistor 110, or the select gate of the memory cell 100, is coupled to a select gate line (SGL) of the memory device. The control diffusion region or other plate of the capacitor is coupled to a control gate line (CGL) of the memory device. In some embodiments, the control gate 150 is implemented as a capacitor. In one embodiment, the SGL is disposed along a first direction, such as a wordline direction, while the BL is disposed along a second direction, such as the bitline direction. The first and second directions, for example, are orthogonal to each other. As for the CGL, it is disposed along the wordline direction and the SL is disposed along the bitline direction. Other configurations of BL, CGL, SGL and SL may also be useful. For example, the SL may be a common SL for memory cells of an array.

Figure 2A:
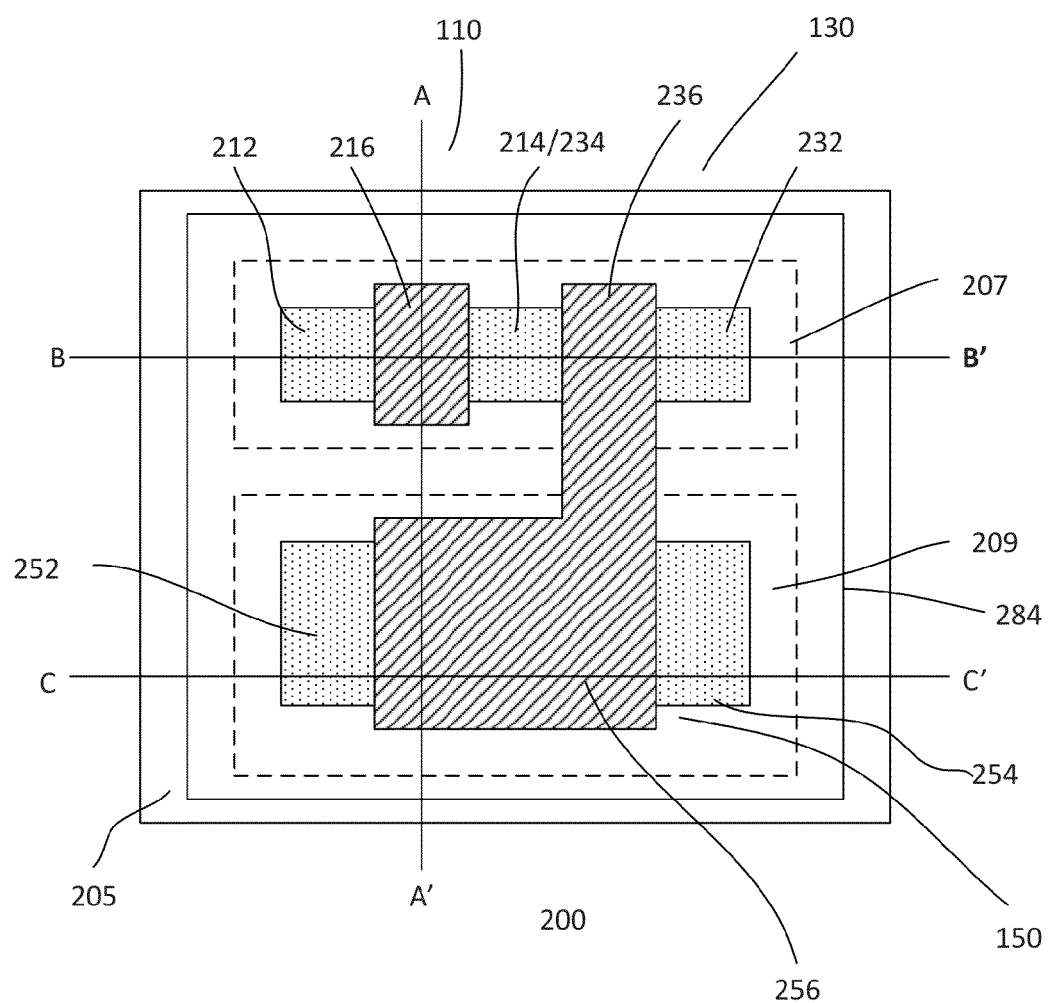
FIGS. 2a-2d show various views of one embodiment of the memory cell of FIG. 1.
Figure 2B:
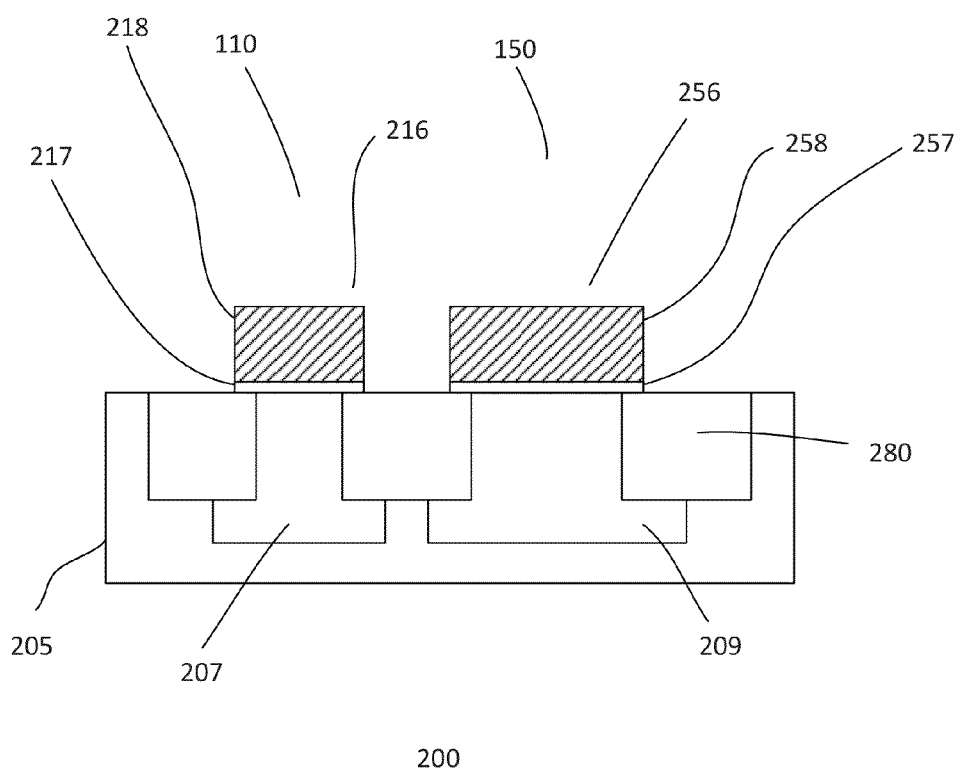
Figure 2C:
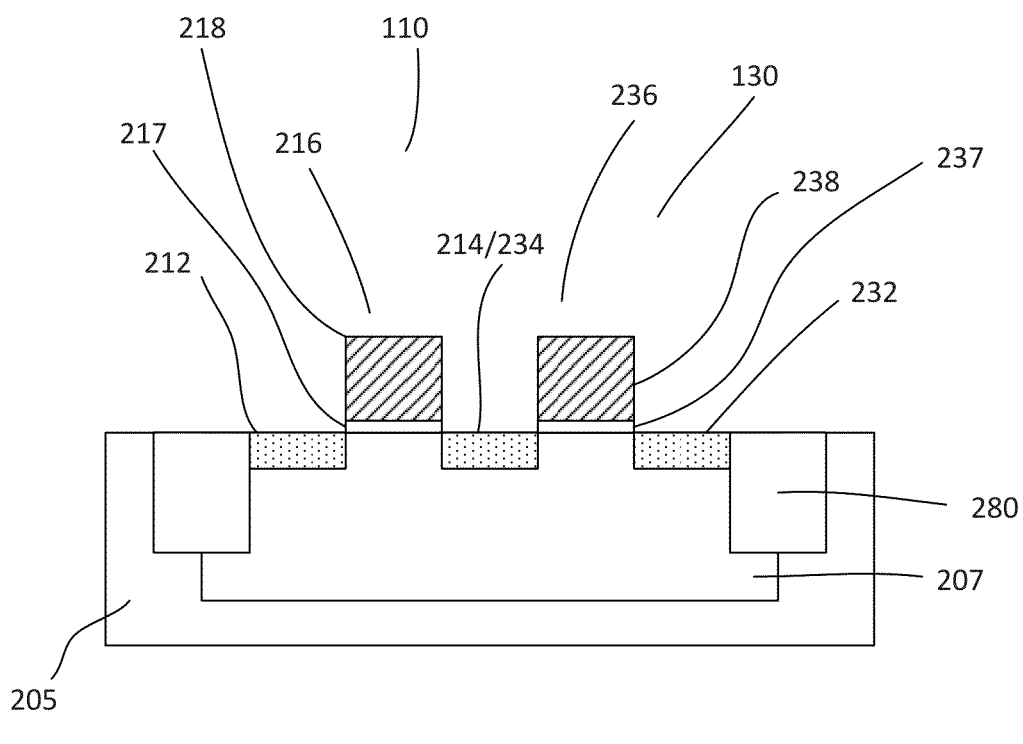
Figure 2D:
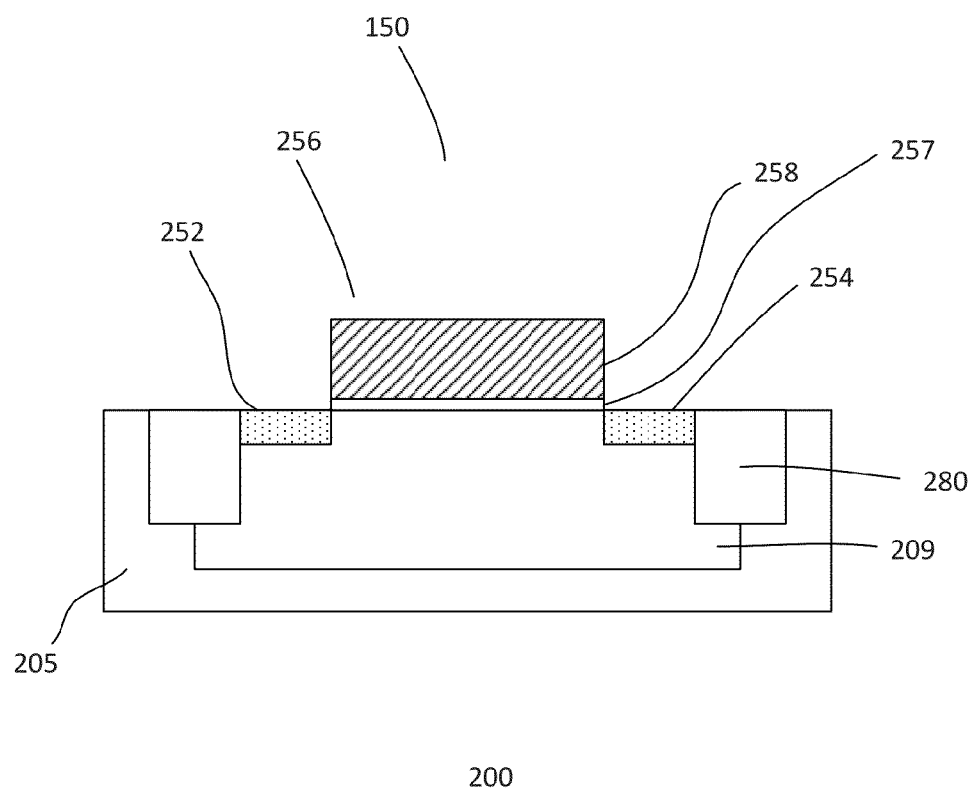

FIGS. 2a-2d show various views of one embodiment of a device. The device includes a memory cell 200. FIG. 2a shows a top view of the memory cell while FIGS. 2b-2d show cross-sectional views along A-A', B-B' and C-C' respectively. The memory cell 200 shown is a non-volatile memory cell. For example, the memory cell is a non-volatile MTP memory cell. The device is disposed on a substrate 205. The substrate is a semiconductor substrate, such as a silicon substrate. Other types of semiconductor substrates may also be useful. The substrate may include a cell region 284.

The device may include doped regions having different dopant concentrations. For example, the device may include heavily doped ($x^+$), intermediately doped (x) and lightly doped ($x^-$) regions, where x is the polarity type which can be p-type or n-type dopants. A lightly doped region may have a dopant concentration of about $1E11$-$1E13$ cm$^{-2}$, an intermediately doped region may have a dopant concentration of about $1E13$-$1E15$ cm$^{-2}$, and a heavily doped region may have a dopant concentration of about $1E15$-$1E17$ cm$^{-2}$. Providing other dopant concentrations for the different types of doped regions may also be useful. For example, the dopant concentration range may be varied, depending on the technology node. P-type dopants may include boron (B), aluminum (Al), indium (In) or a combination thereof, while n-type dopants may include phosphorous (P), arsenic (As), antimony (Sb) or a combination thereof.

A cell region 284 is provided in the substrate. The cell region, for example, is a cell region in which the memory cell is disposed. Although one cell region is shown, the device may include a plurality of cell regions having memory cells interconnected to form a memory array. Additionally, the substrate may include other types of device regions, depending on the type of device or IC. For example, the device may include device regions for high voltage (HV), intermediate voltage (IV) and/or low voltage (LV) devices.

The cell region includes first and second wells 209 and 207. The first well serves as a well for a control capacitor 150 while the second well serves as a transistor well. For example, the transistor well serves as a well for access (or select) and storage transistors 110 and 130. As shown, the wells are disposed adjacent to each other. The first well accommodates the control capacitor and the second well accommodates the access and storage transistors. The capacitor well includes capacitor type dopants and the transistor well includes transistor type dopants. The capacitor type dopant concentration of the capacitor well may be a light dopant concentration. For example, the dopant concentration of the capacitor well may be about $1E11$-$1E13$ cm$^{-2}$. As for the transistor well, it may include a light dopant concentration of transistor type dopants. For example, the dopant concentration of transistor type dopants in the transistor well may be about $1E11$-$1E13$ cm$^{-2}$. Other capacitor and/or transistor type dopant concentrations may also be useful.

The polarity type of the capacitor well dopant is the same as the capacitor type dopant. For example, the capacitor well dopant is p-type for a p-type MOS capacitor and n-type for a n-type MOS capacitor. As for the polarity of the transistor well dopant, it is the opposite of the transistor type dopant. For example, the transistor well dopant type for p-type MOS transistors is n-type.

The cell isolation region 280, as shown, separates the first and second wells as well as the other device regions. The cell isolation region sufficiently isolates the different wells. For example, the cell isolation region provides sufficient overlap to the different wells. The cell isolation region defines the active region in the first and second wells. For example the cell isolation region defines the active transistor regions of the transistors in the second well and active capacitor region in the first well.

Access and storage transistors are disposed in the transistor active region in the second or transistor well. A transistor includes a gate between first and second diffusion regions. The diffusion regions have dopants of the same polarity type as the transistor type dopants. For example, p-type transistors have diffusion regions with p-type dopants. The diffusion regions, for example, are heavily doped regions. The gate is disposed on the substrate while the diffusion regions are disposed in the active region. A gate includes a gate electrode and a gate dielectric. The gate electrode, for example, may be polysilicon gate electrode and the gate dielectric may be silicon oxide gate dielectric. Other types of gate electrode or dielectric materials may also be useful.

For example, the access transistor 110 includes first and second access diffusion regions 212 and 214 heavily doped with transistor type dopants in the transistor active region and an access gate 216 on the substrate. The access gate includes an access gate electrode 218 over an access gate dielectric 217. The access gate may be referred to as a select gate. The storage transistor 130 includes first and second storage diffusion regions 232 and 234 heavily doped with transistor type dopants in the substrate and a storage gate 236 on the substrate. The storage gate includes a storage gate electrode 238 over a storage gate dielectric 237, as shown in FIG. 2c. The storage gate may be referred to as a floating gate. The access and storage transistors 110 and 130 are coupled in series. In one embodiment, the second access diffusion region 214 and second storage diffusion region 234 form a common diffusion region of the transistors. Other configurations of series connection for the access and storage gates may also be useful.

The control capacitor is disposed on the first well. The control capacitor includes a control gate 256 disposed on the substrate over the capacitor active region within the first (or capacitor) well. The control gate includes a control gate electrode 258 over a control gate dielectric 257, as shown in FIG. 2b and FIG. 2d. The control gate electrode 258, for example, may be a polysilicon control gate electrode and the control gate dielectric 257 may be silicon oxide control gate dielectric. Other types of gate electrode or dielectric materials may also be useful. First and second capacitor diffusion regions 252 and 254 are disposed in the substrate in the capacitor active region adjacent to the control gate. The capacitor diffusion regions, in one embodiment, are heavily doped with capacitor type dopants. The capacitor diffusion regions serve as a contact region to a well capacitor plate formed by, for example, the first or capacitor well while the gate electrode serves as the other (or gate capacitor) plate.

In one embodiment, the control gate and storage electrodes 258 and 238 are commonly coupled. In one embodiment, the control gate 256 and storage gate 238 are formed of the same gate layer. For example, patterning the gate layer create the control and storage gates. In such cases, the control gate 256 and storage gate 238 are formed of the same material. For example, the gate electrodes are doped with capacitor type dopants. In one embodiment, the access, storage and control gates are formed from the same gate layer. Other configurations of the gates may also be useful. For example, the gates may be formed from different gate layers.

The first access diffusion region 212 is coupled to a BL of the memory device. The first storage diffusion region 232 is coupled to a SL of the memory device. The access gate 216 is coupled to a SGL of the memory device. The control diffusion regions 252 and 254 are coupled to a CGL of the memory device. In some embodiments, the control gate 256 is implemented as a control capacitor 150. In one embodiment, the SGL is disposed along a first direction, such as a wordline direction, while the BL is disposed along a second direction, such as the bitline direction. The CGL may be disposed along the wordline direction and the SL is disposed along the bitline direction. Other configurations of BL, CGL, SGL and SL may also be useful.

The various lines of the memory cell may be disposed in metal levels (M) of the device. The conductive lines disposed in the same direction may be provided in the same metal level. For example, WL and CGL may be disposed on the same level while BL and SL may be disposed on the same level. For example, WL and CGL may be disposed on M1 while BL and SL may be on M2 of the device. Other configurations of conductive lines and metal levels may also be useful.

The memory cell described has improved or more efficient programming due to increased capacitive coupling ratio. For example, the layout of the control gate (CG) and floating gate (FG) can be designed to have an area ratio to produce the desired capacitive coupling ration. In some embodiments, an area ratio of CG:FG may be about 0.8:0.2. For example, W×L of the floating gate may be about 0.4×0.28, while W×L of the control gate may be about 1.6×0.84. Providing other CG:FG area ratios may also be useful. By providing a large area for the control gate, a high bias on the capacitor well can be generated. This bias is transferred to the floating gate for efficient programming of the memory cell.

Figure 3A:
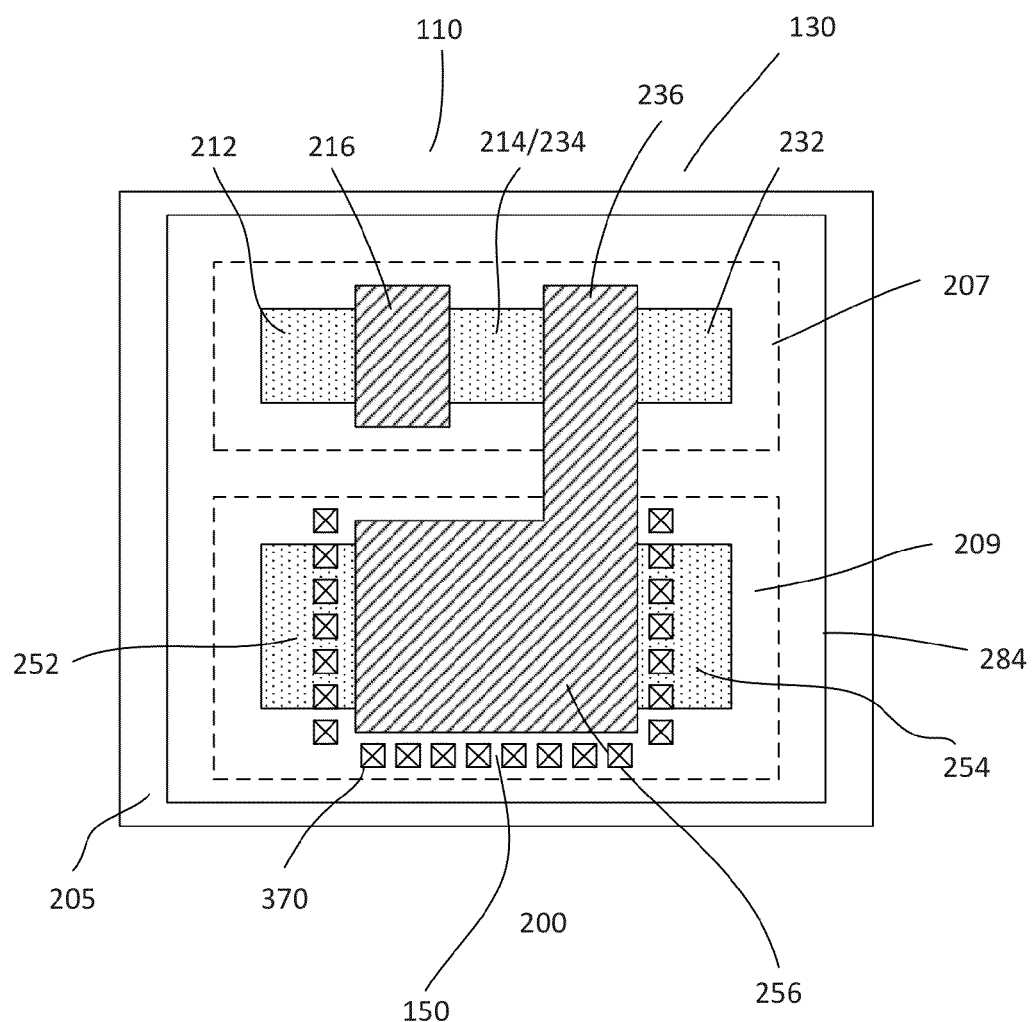
FIGS. 3a and 3b show embodiments of other memory cells.
Figure 3B:
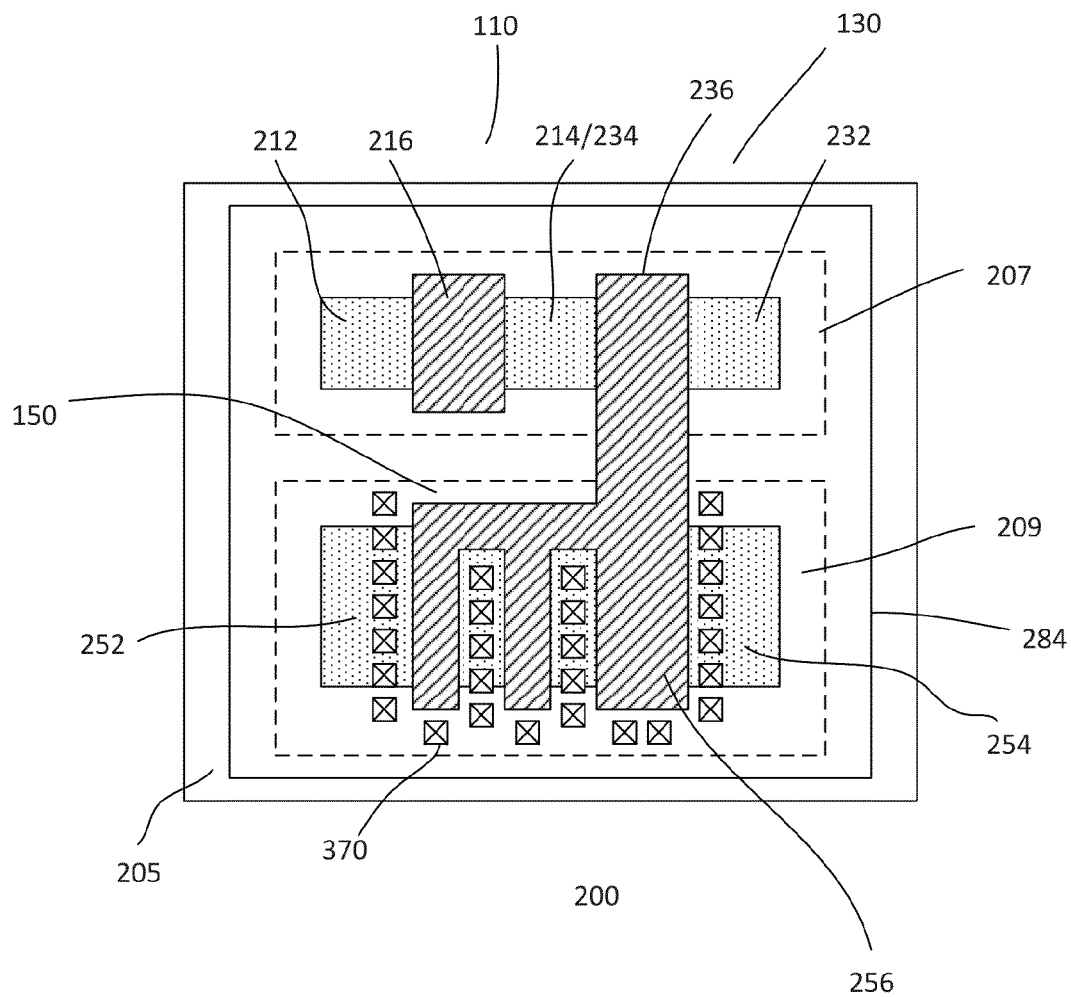

FIGS. 3a-3b show plan views of memory cells 300 with increased coupling ratio. The memory cells are similar to those described in FIG. 1 and FIGS. 2a-2d. Common elements may not be described or described in detail.

Increased capacitive coupling may be achieved by providing multiple contacts 370 coupled to the well capacitor plate 209 of the capacitor 150. The contacts, for example, are provided which surrounds the control gate 150, coupling the well capacitor plate to a CGL. The number of contacts may depend on the circumference of the CG and contact size and pitch. However, the greater the number of contacts, the higher the capacitance. The number of contacts may be increased by providing a CG with fingers. For example, one or more spaces may be provided to separate the CG into multiple fingers, as shown in FIG. 3b. Contacts may be provided surrounding the control gate and within the spaces between the fingers. This type of CG layout leads to a larger number of contacts provided as compared to the CG layout of FIG. 3a, thereby increasing capacitance.

Figure 4:
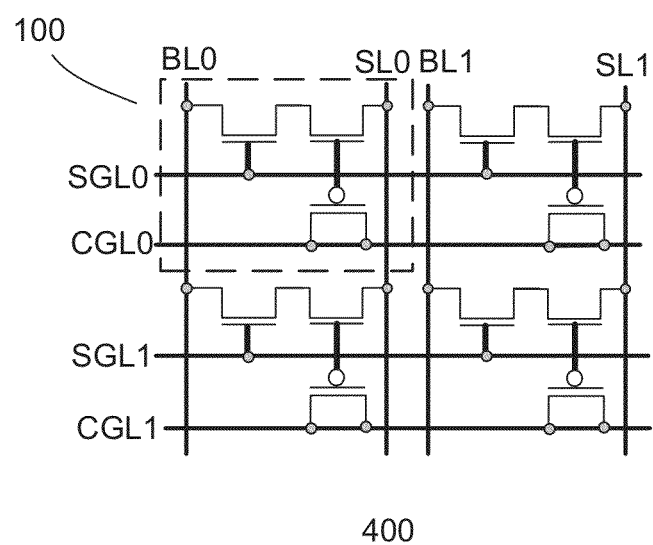
FIG. 4 shows a schematic diagram of an array of memory cells.

FIG. 4 shows a schematic diagram of an embodiment of an array 400 of memory cells. A portion of the array is shown with, for example, four memory cells 100, such as those described in FIG. 1. Common elements may not be described or described in detail. The memory cells are interconnected to form two columns connected by BLs (BL0 and BL1) and SLs (SL0 and SL1) and two rows of memory cells connected by SGLs (SGL0 and SGL1) and CGLs (CGL0 and CGL1). For example, the portion is a 2×2 portion of the array. It is understood that the array may include numerous rows and columns.

The memory cell of FIGS. 1 and 2a-2d may be configured in various combinations. For example, the memory cell may be configured to include first type transistors and a first type capacitor. In one embodiment, the first type is n-type. For example, the memory cell is configured with n-type transistors and n-type capacitor. In such cases, the transistor or second well 207 and capacitor or first well 209 include opposite type dopants. The transistor well includes a second type or p-type transistor dopants while the capacitor well includes a first type or n-type capacitor dopants. The diffusion regions of the transistor and capacitor are both n-type. Furthermore, the gate electrodes are doped with capacitor type dopants. For example, the gate electrodes are doped with n-type dopants.

For a memory cell with first type transistors and capacitor which are n-type, various operating modes are described in FIGS. 5a-5e. Table 1 below shows various signals at the various terminals of a memory cell for the different operating modes:

TABLE 1

| Signals | CGL | | BLn | | SLn | | SG (nFET) | | PW (transistor well) |
|---|---|---|---|---|---|---|---|---|---|
| Modes | sel | unsel | sel | unsel | sel | unsel | sel | unsel | |
| PGM: CHE (bit) | $+V_{prog}$ | 0 V | 0 V | $+V_{inhibit}$ | $+V_{SL}$ | 0 V | $+V_{CC}$ | 0 V | 0 V |
| ERS: FN Source-Side (block) | 0 V | 0 V | 0 V | 0 V | $+V_{ers}$ | $+V_{ers}$ | 0 V | 0 V | 0 V |
| ERS: FN S/D Overlap (block) | 0 V | 0 V | $+V_{ers}$ | $+V_{ers}$ | $+V_{ers}$ | $+V_{ers}$ | $+V_{CC}$ | $+V_{CC}$ | 0 V |
| Read | 0 V | 0 V | $+V_{CC}$ | 0 V | 0 V | 0 V | $+V_{CC}$ | 0 V | 0 V |

Select (sel) signals are provided at the terminals of a selected cell while unselect (unsel) signals are provided at terminals of non-selected cells.

Table 2 below shows exemplary voltages for the different signals:

TABLE 2

| Signals | Values Volts |
|---|---|
| $+V_{prog}$ | 9 (CHE) |
| $+V_{ers}$ | 13 |
| $+V_{SL}$ | 9 (CHE) |
| $+V_{CC}$ | 5 |

The values in Table 2 are exemplary. For example, the values are for an operating voltage Vcc equal to about 5V. Other voltage values may also be useful.

Figure 5A:
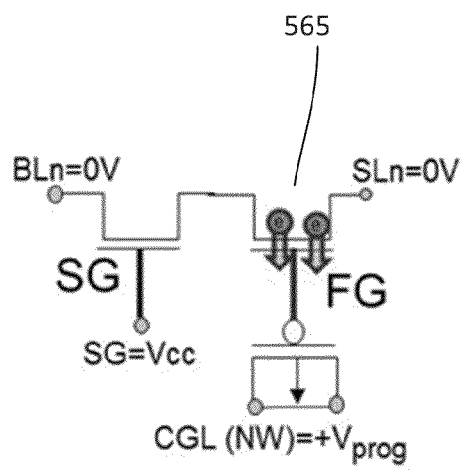
FIGS. 5a-5e show various operations of a memory cell.
Figure 5B:
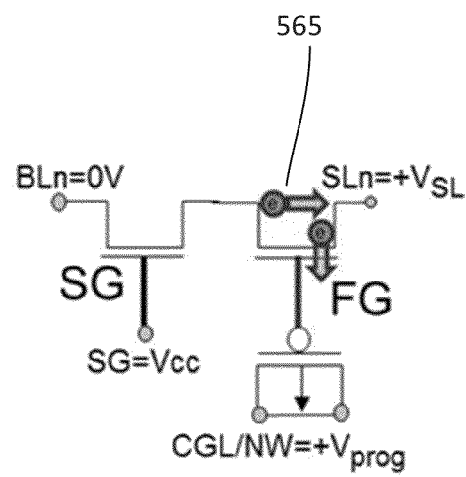

The memory cell may operate in two types of programming modes. One programming mode is a Fowler-Nordheim (FN) tunneling program mode 500a, as illustrated in FIG. 5a. To effect a FN tunneling program operation, the various sel signals for such a program operation are provided at the various terminals of the selected memory cell. In FN tunneling programming mode, electron carriers 565 tunnel through from the transistor well to the floating gate (FG). The other programming mode is a channel hot electron (CHE) injection programming mode 500b, as shown in FIG. 5b. To effect a CHE injection programming operation, the various sel signals for such a program operation are provided at the various terminals of the selected memory cell. In the CHE programming mode, electron carriers 565 are injected from the transistor well to the FG on the source side.

Figures 5C, 5D:
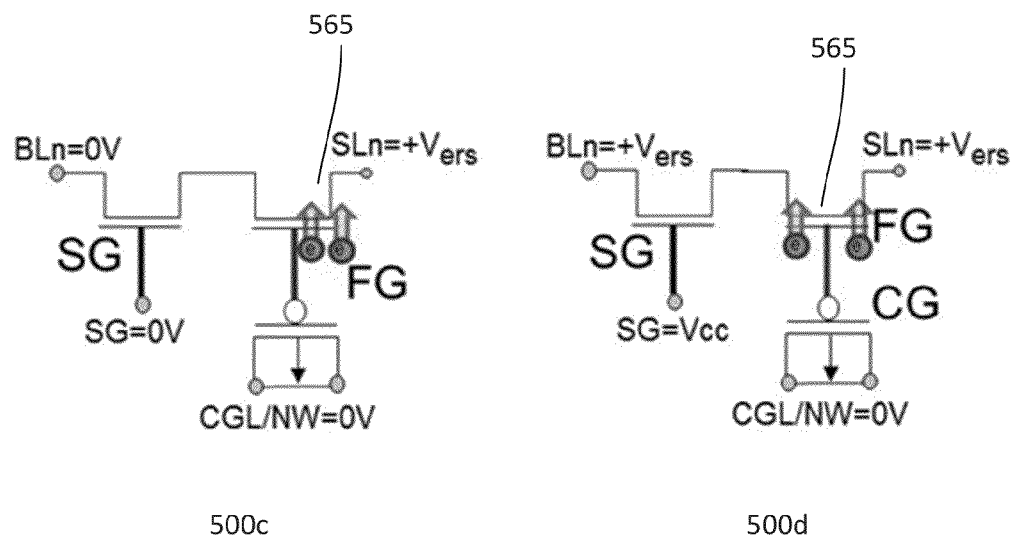

The memory cell may operate in two types of erase modes. One erase mode is a FN source-side erase mode 500c, as illustrated in FIG. 5c. To effect a FN source-side erase operation, the various sel signals for such an erase mode are provided at the various terminals of the selected memory cell. In source-side erase mode, electron carriers 565 move from the FG to the transistor well from the source-side of the gate. The other erase mode is source-drain (S-D) overlap erase mode 500d, as shown in FIG. 5d. To effect a S-D overlap erase operation, the various sel signals for such an erase operation are provided at the various terminals of the selected memory cell. In the S-D overlap erase mode, electron carriers 565 are moved from the FG to the transistor well from both source and drain sides of the gate.

Figure 5E:
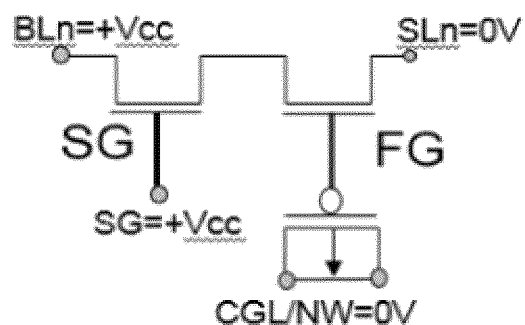

As for a read operation 500e, it is illustrated in FIG. 5e. The various select (sel) signals for a read operation are provided at the various terminals of the selected memory cell to effect the read operation.

In other embodiments, the memory cell may be configured to include first type transistors and capacitor which are p-type transistors and capacitors. In such cases, the transistor well includes second type or n-type transistor dopants and the capacitor well includes first type or p-type capacitor dopants. The diffusion regions of the transistor and capacitor are both p-type. Furthermore, the gate electrodes are doped with capacitor type dopants. For example, the gate electrodes are doped with p-type dopants.

For a memory cell with first type transistors and a capacitor which are p-type, various operating modes are described in FIGS. 6a-6e. Table 3 below shows various signals at the various terminals of a memory cell for the different operating modes:

TABLE 3

| Signals | CGL | | BLp | | SLp | | SG (pFET) | | NW (transistor well) |
|---|---|---|---|---|---|---|---|---|---|
| Modes | Sel | unsel | sel | unsel | sel | unsel | sel | unsel | |
| PGM: CHH-HE (bit) | $-V_{prog}$ | 0 V | 0 V | $-V_{CC}$ | $-V_{SL,prog}$ | 0 V | $-V_{CC}$ | 0 V | 0 V |
| PGM: BTBT HE (bit) | $+V_{prog}$ | 0 V | F | F | $-V_{SL,prog}$ | 0 V | F | F | $+V_{CC}$ or 0 V |
| ERS: FN Source-Side (block) | 0 V | 0 V | 0 V | 0 V | $+V_{ers}$ | $+V_{ers}$ | 0 V | 0 V | $+V_{ers}$ |
| ERS: FN Channel (block) | 0 V | 0 V | $+V_{ers}$ | $+V_{ers}$ | $+V_{ers}$ | $+V_{ers}$ | $-V_{CC}$ | $-V_{CC}$ | $+V_{ers}$ |
| Read | 0 V | 0 V | $-V_{CC}$ | 0 V | 0 V | 0 V | $-V_{CC}$ | 0 V | 0 V |

Select signals are provided at the terminals of a selected cell while unsel signals are provided at terminals of non-selected cells.

Figure 6A:
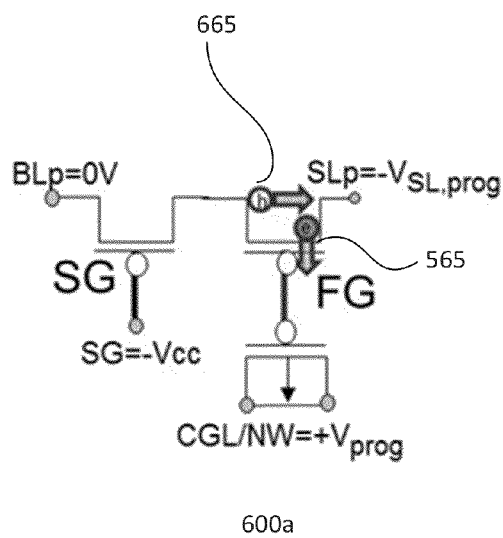
Figure 6B:
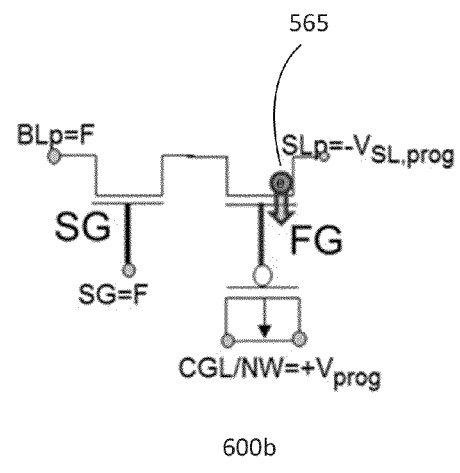

The memory cell may operate in two types of programming modes. One programming mode is a channel hot hole-hot electron (CHH-HE) injection programming mode 600a, as illustrated in FIG. 6a. To effect a CHH-HE program operation, the various sel signals for such a program operation are provided at the various terminals of the selected memory cell. In CHH-HE programming mode, hole carriers 665 from the drain side of the FG are injected into the channel while electron carriers 565 are injected into the FG from the channel. The other programming mode is a band-to-band tunneling induced hot electron (BTBT-HE) injection programming mode 600b, as shown in FIG. 6b. To effect a BTBT-HE programming operation, the various sel signals for such a program operation are provided at the various terminals of the selected memory cell. In the BTBE-HE programming mode, electron carriers 565 are injected from the transistor well to the FG on the source side.

The memory cell may operate in two types of erase modes. One erase mode is a FN source-side erase mode 600c, as illustrated in FIG. 6c. To effect a FN source-side erase operation, the various sel signals for such an erase mode are provided at the various terminals of the selected memory cell. In source-side erase mode, electron carriers 565 move from the FG to the transistor well from the source-side of the gate. The other erase mode is FN Channel erase mode 600d, as shown in FIG. 6d. To effect a FN Channel erase operation, the various sel signals for such an erase operation are provided at the various terminals of the selected memory cell. In the FN Channel erase mode, electron carriers 565 are moved from the FG to the transistor well.

Figure 6E:
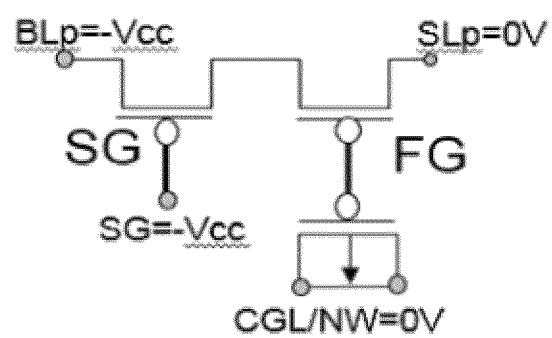

As for a read operation 600e, it is illustrated in FIG. 6e. The various select (sel) signals for a read operation are provided at the various terminals of the selected memory cell to effect the read operation.

In some other embodiments, the transistors and capacitor are of the opposite type. For example, the transistors are first type transistors and the capacitor is a second type capacitor. In one embodiment, the first type transistors are p-type transistors and the second type capacitor is a n-type capacitor. In such cases, the transistor well includes second type or n-type transistor dopants and the capacitor well includes second type or n-type capacitor dopants. The diffusion regions of the transistors are p-type while the diffusion regions of the capacitor are n-type. Furthermore, the gate electrodes are doped with capacitor type dopants. For example, the gate electrodes are doped with n-type dopants.

Figure 7:
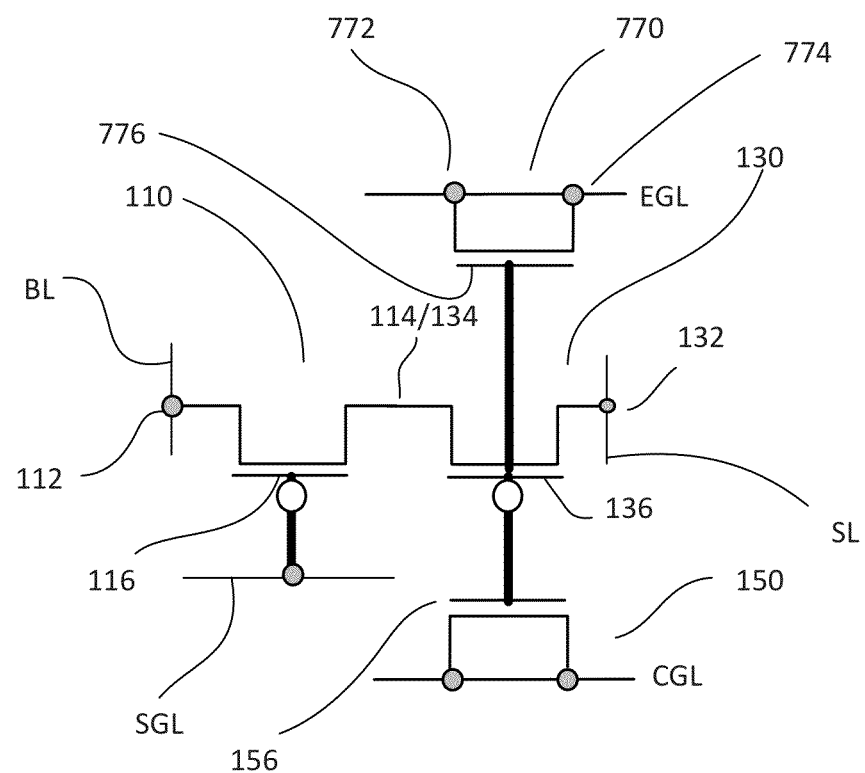
FIG. 7 shows a schematic diagram of another memory cell.

FIG. 7 shows a schematic diagram of an embodiment of a memory cell 700. The memory cell, in one embodiment, is a NVM cell. For example, the memory cell is a NVM MTP cell. The memory cell is similar to that described in FIGS. 1, 2a-2d and 3a-3b. Common elements may not be described or described in detail.

In addition to the first transistor 110, the second transistor 130 and the control capacitor 150, the memory cell further includes an erase capacitor 770. The erase capacitor includes an erase capacitor gate 776 and first and second erase capacitor diffusion regions 772 and 774. The erase capacitor gate is commonly coupled to the storage transistor gate 136 and control gate 156. The control gate 156, the storage gate 136 and erase gate 776 are commonly coupled. The control, storage and erase gate electrodes form a common gate electrode. Other configurations of the gates may also be useful.

The erase diffusion regions are coupled to an erase gate line (EGL). In one embodiment, the SGL and EGL are disposed along a first direction, such as a wordline direction, while the BL is disposed along a second direction, such as the bitline direction. The first and second directions, for example, are orthogonal to each other. As for the CGL, it is disposed along the wordline direction and the SL is disposed along the bitline direction. Other configurations of BL, CGL, SGL, EGL and SL may also be useful.

The memory cell, as described, provides decoupled erase and programming paths. Separate erase and programming paths improves the reliability of the memory cell. For example, wear and tear usually occurs at the tunneling dielectric due to build-up of oxide defects during programming and erase operations. With the erase and programming paths/operations decoupled, e.g., by having erase and programming operations occur at different regions of the memory cell, the gate dielectric break down is decreased, increasing reliability of the memory cell.

In one embodiment, the transistors and capacitors are configured as first type transistors and capacitors. In one embodiment, the transistors and capacitors are configured as p-type (or first type) transistors and capacitors. Other configurations of transistors and capacitors may also be useful.

Figure 8:
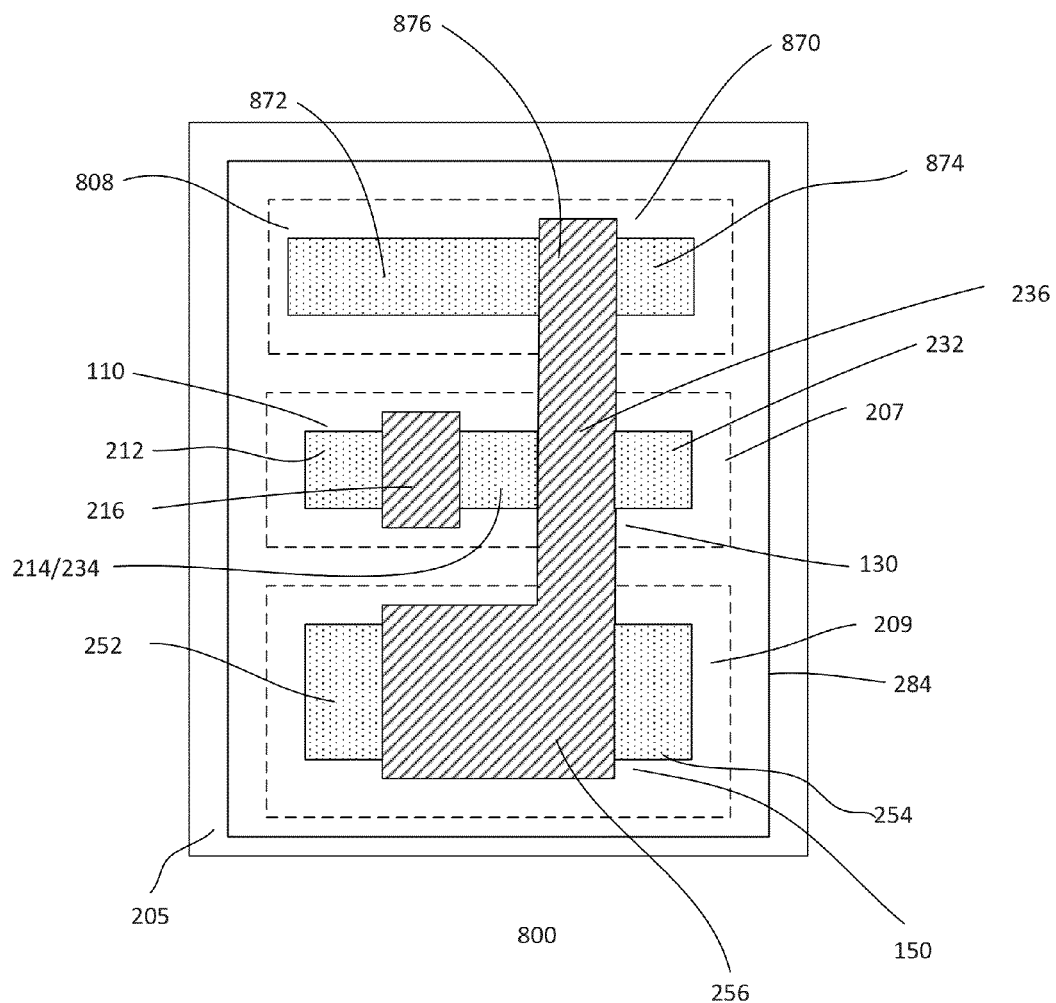
FIG. 8 shows a layout of the memory cell of FIG. 7.

FIG. 8 shows a plan view of an embodiment of a memory cell 800. The memory cell, in one embodiment, is a NVM cell. For example, the memory cell is a NVM MTP cell. The memory cell is similar to that described in FIGS. 1, 2a-2d, 3a-3b and FIG. 7. Common elements may not be described or described in detail.

As shown, the cell region includes a third well 808, in addition to the first and second wells 209 and 207. The first well serves as a control capacitor well with control capacitor type dopants, the second well serves as a transistor well with transistor type dopants and the third well serves as an erase capacitor well with erase capacitor type dopants. In one embodiment, the control and erase capacitor type dopants are the same type. For example, for p-type control and erase capacitors, the capacitor dopants are p-type dopants.

An erase capacitor 870 includes an erase gate 876 with first and second erase diffusion regions 872 and 874 disposed adjacent thereto. The erase diffusion regions are heavily doped regions with erase capacitor type dopants and serve as contact regions to the erase capacitor well. The various gates may include polysilicon gate electrodes over a silicon gate dielectric. Other types of gate electrode or dielectric materials may also be useful.

In one embodiment, the control, storage and erase gate electrodes are commonly coupled. In one embodiment, the control, storage and erase gates are formed of the same gate layer. For example, patterning the gate layer creates the control, storage and erase gates 256, 236 and 876. In such cases, the gates are formed of the same material. For example, the gate electrodes are doped with control and erase capacitor type dopants. In one embodiment, the various gates of the memory cell are formed from the same gate layer. Other configurations of the gates may also be useful. For example, the gates may be formed from different gate layers.

The first access diffusion region 212 is coupled to a BL of the memory device. The first storage diffusion region 232 is coupled to a SL of the memory device. The access gate 216 is coupled to a SGL of the memory device. The control capacitor diffusion regions 252 and 254 are coupled to a CGL of the memory device. The erase capacitor diffusion regions 872 and 874 are coupled to EGL. In one embodiment, the SGL and EGL are disposed along a first direction, such as a wordline direction, while the BL is disposed along a second direction, such as the bitline direction. The CGL may be disposed along the wordline direction and the SL is disposed along the bitline direction. Other configurations of BL, CGL, SGL, EGL and SL may also be useful.

The various lines of the memory cell may be disposed in metal levels (M) of the device. The conductive lines disposed in the same direction may be provided in the same metal level. For example, WL, CGL and EGL may be disposed on the same level while BL and SL may be disposed on the same level. For example, WL, CGL and EGL may be disposed on M1 while BL and SL may be on M2 of the device. Other configurations of conductive lines and metal levels may also be useful.

The memory cell as described has improved or more efficient programming due to increased capacitive coupling ratio. For example, the layout of the control and floating gates can be designed to have an area ratio to produce the desired capacitive coupling ratio. In some embodiments, an area ratio of CG:FG may be about 0.8:0.2. For example, W×L of the floating gate may be about 0.4×0.28, while W×L of the control gate may be about 1.6×0.84. Providing other CG:FG area ratios may also useful. By providing a large area for the control gate, a high bias on the capacitor well can be generated. This bias is transferred to the floating gate for efficient programming of the memory cell. As for the EG, it has about the same W×L as the storage gate. For example, the area of CG:FG is about 1. Furthermore, the CG can be configured with a layout as described in FIGS. 3a-3b.

In an alternative embodiment, the erase gate 870 is a metal in metal (MIM) capacitor. For example, the erase gate of FIG. 8 may be replaced by a MIM capacitor in such a way that erase operation may be done by using high positive bias on the erase gate to extract electrons out of the floating gate. In such cases, the layout of the transistor and control capacitor is similar to that described in FIGS. 2a-2d and 3a-3b. However, the erase capacitor would be disposed on metal levels above the device and coupled to the storage gate.

The memory cells of FIGS. 7-8 may be configured as an array, similar to that shown in FIG. 4. For example, the memory cells may be interconnected to form columns and rows of memory cells. Columns, for example, are connected by BLs and SLs while rows are connected by SGLs, CGLs and EGLs.

The memory cell, in one embodiment, is configured with first type transistors and first type capacitors. In one embodiment, the first type is p-type. For example, the memory cell is configured with p-type transistors and p-type capacitors. In such cases, the transistor or second well 207 and capacitor or first and third wells 209 and 808 include opposite type dopants. The transistor well includes a second type or n-type transistor dopants while the capacitor wells include a first type or p-type capacitor dopants. The diffusion regions of the transistor and capacitor are both p-type. Furthermore, the gate electrodes are doped with capacitor type dopants. For example, the gate electrodes are doped with p-type dopants.

Figure 9A:
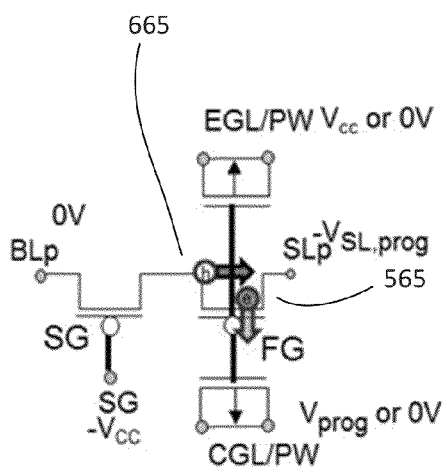
FIGS. 9a-9c show various operations of yet another memory cell.
Figure 9B:
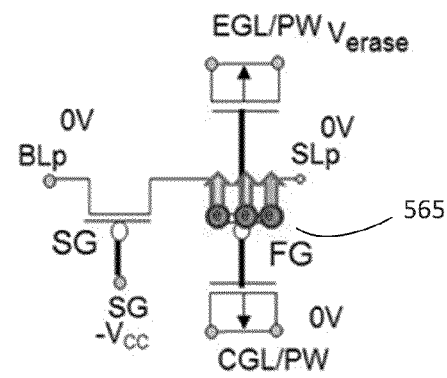
Figure 9C:
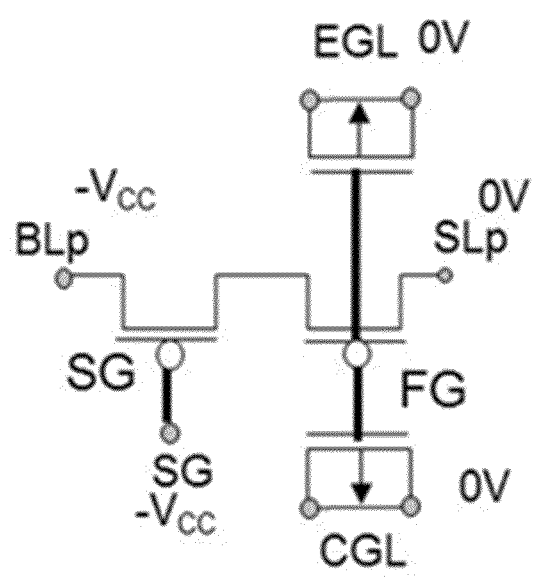

For first type transistors and capacitor which are p-type, various operating modes are described in FIGS. 9a-9c.

In the programming mode, the memory cell may operate in a CHH-HE injection programming mode 900a, as illustrated in FIG. 9a. To effect a CHH-HE program operation, the various sel signals for such a program operation is provided at the various terminals of the selected memory cell. In CHH-HE programming mode, hole carriers 665 from the drain side of the FG are injected into the channel while electron carriers 565 are injected into the FG from the channel.

In the erase mode, the memory cell may operate in a FN Channel erase mode 900b, as shown in FIG. 9b. To effect a FN Channel erase operation, the various sel signals for such an erase operation is provided at the various terminals of the selected memory cell. In the FN Channel erase mode, electron carriers 565 are moved from the FG to the transistor well.

As for a read operation 900c, it is illustrated in FIG. 9c. The various select (sel) signals for a read operation is provided at the various terminals of the selected memory cell to effect the read operation.

Figure 10:
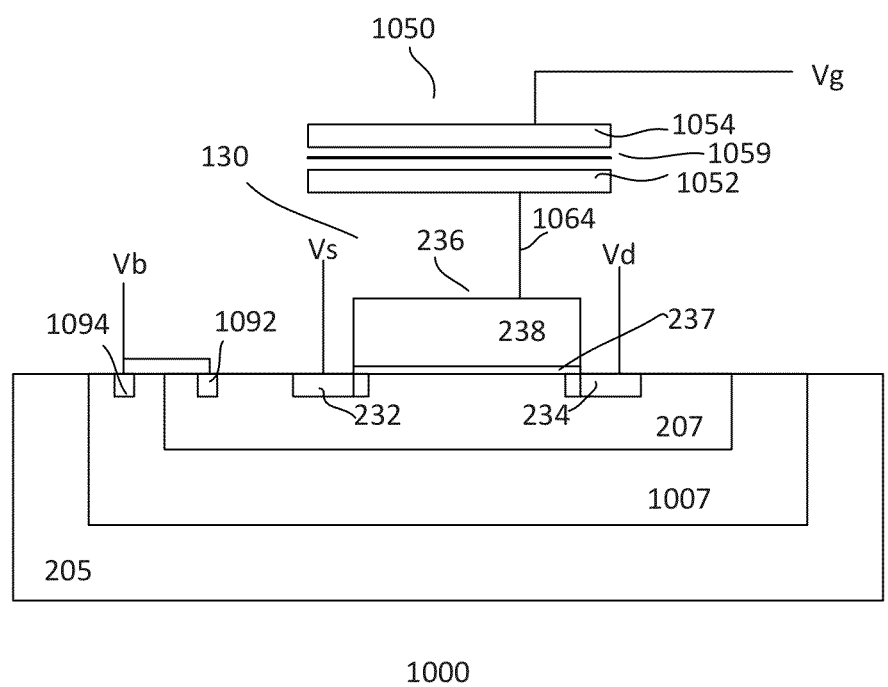
FIG. 10 shows another embodiment of a memory cell.

FIG. 10 shows a simplified alternative embodiment of a memory cell 1000. The memory cell, in one embodiment, is a NVM cell. For example, the memory cell is a NVM MTP cell. The memory cell is similar to that described in FIGS. 1, 2a-2d, 3a-3b, 7 and 8. Common elements may not be described or described in detail.

As shown, a substrate 205 includes a cell region 284. The substrate, for example, is a silicon substrate. Other types of substrates may also be useful. In one embodiment, the substrate is a p-type substrate. For example, the substrate is a lightly doped p-type silicon substrate. The cell region includes a device or second well 207. The device well, for example, is a transistor well, accommodating a transistor. In one embodiment, the device well accommodates a storage transistor 130. The transistor well includes transistor well dopants. The transistor, for example, may be lightly doped with transistor well dopants.

A cell isolation region (not shown) isolates the second well from other device regions. The cell isolation region defines the active region in the second well. For example, the cell isolation region defines the active transistor region of the storage transistor in the second well.

In one embodiment, an isolation well 1007 may be provided in the substrate. The isolation well may be a deep isolation well, encompassing the second well. The isolation well includes isolation well dopants. For example, the isolation well is lightly doped with isolation well dopants. In one embodiment, isolation well dopants are of opposite polarity type to that of the transistor well dopants. Since the polarity type of transistor well dopants is the opposite to the type of transistor, the isolation well dopant is the same polarity type as the type of transistor. For example, the transistor well dopant is p-type while the isolation well dopants are n-type for a n-type MOS transistor.

Transistor and isolation well contacts 1092 and 1094 are provided on the substrate of the transistor and isolation wells. The well contacts are heavily doped regions with the same dopants as the well. For example, transistor well contact is heavily doped with transistor well dopants while the isolation well contact is heavily doped with isolation well dopants.

The storage transistor 130 is disposed in the transistor active region in the transistor well. The storage transistor includes a storage gate 236 between first and second storage diffusion regions. The storage gate is disposed on the substrate while the diffusion regions are disposed in the active region. The storage gate includes a storage gate electrode 238 over a storage gate dielectric 237. The storage gate may be referred to as a floating gate. The gate electrode, for example, may be polysilicon gate electrode and the gate dielectric may be silicon oxide gate dielectric. Other types of gate electrode or dielectric materials may also be useful.

The storage transistor includes first and second storage diffusion or source/drain (S/D) regions 232 and 234. The diffusion regions have S/D dopants. The S/D dopants are of the same polarity type as the type of transistor. For example, S/D dopants are n-type for a n-type MOS transistor. The diffusion regions, for example, are heavily doped with S/D dopants.

A capacitor 1050 is coupled to the storage gate. The capacitor, in one embodiment, is a metal-in-metal (MIM) capacitor. The MIM capacitor includes first and second metal capacitor plates 1052 and 1054 with a capacitor dielectric 1059 between them. The metal capacitor plates, may be copper or copper alloy while the capacitor dielectric may be silicon oxide. Other types of metal or dielectric materials may be useful. In one embodiment, the capacitor is disposed in metal layers of the device or IC. For example, the metal plates are disposed in adjacent metal layers while the capacitor dielectric is the dielectric layer separating the two metal levels. A contact 1064 can be provided, coupling the first or lower capacitor plate to the storage gate, floating the storage gate.

The first S/D region is coupled to a SL and the second S/D region is coupled to a BL. The second capacitor plate is coupled to a wordline (WL). The well contacts are coupled to a bias voltage, biasing the wells or transistor body. In one embodiment, the WL is disposed along a first direction, such as a wordline direction, while the BL is disposed along a second direction, such as the bitline direction. The SL is disposed along the bitline direction. Other configurations of BL, WL and SL may also be useful.

The various lines of the memory cell may be disposed in metal levels (M) of the device. The conductive lines disposed in the same direction may be provided in the same metal level. For example, WL may be disposed on one level while BL and SL may be disposed on another level. Other configurations of conductive lines and metal levels may also be useful.

Figure 11A:
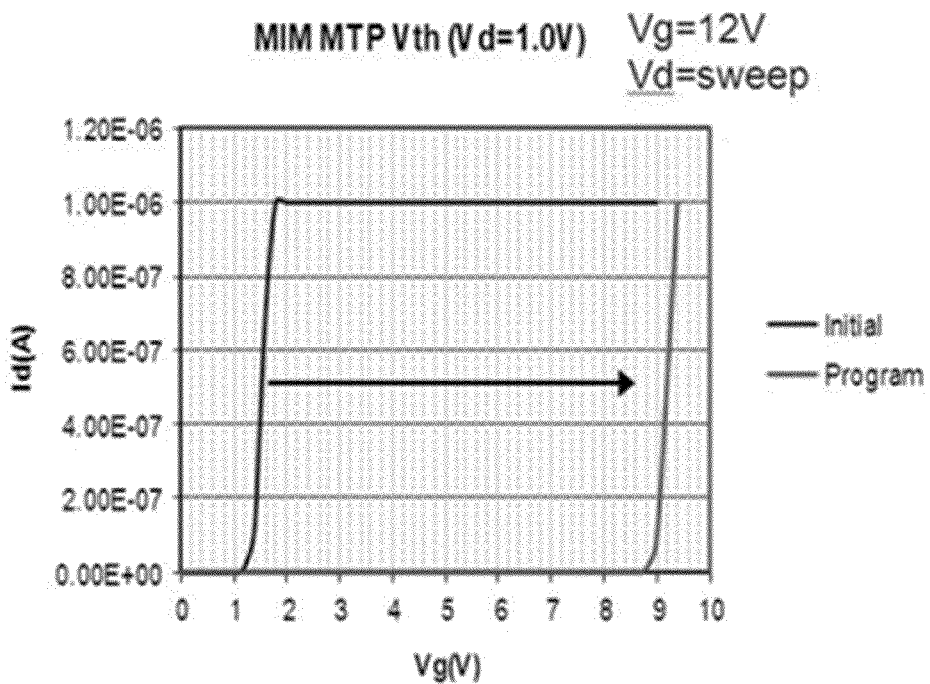
FIGS. 11a-11b show the I-V curves of program and erase operations of the memory cell of FIG. 10.
Figure 11B:
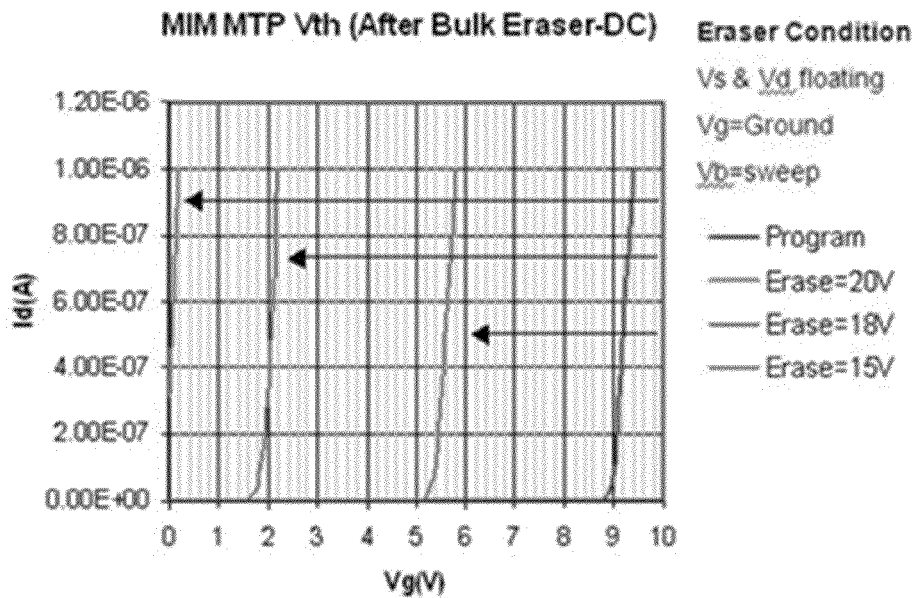

A plurality of memory cells may be interconnected by the various lines to form an array. For example, memory cells may be interconnected by WLs to from rows of memory cells and BLs and SLs to form columns of memory cells. Accessing a memory cell may be achieved by applying appropriate signals to the various lines or terminals of the memory cell. Bit programming of the memory cell is achieved by hot carrier injection to inject electrons into the floating gate. A block or page erase may be achieved by FN electron tunneling from the FG to the substrate. FIGS. 11a-11b show I-V curves of program and erase operations of the memory cell of FIG. 10.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A non-volatile (NV) multi-time programmable (MTP) memory cell comprising:
    a substrate;
    first and second wells disposed in the substrate;
    a first transistor having a select gate and a second transistor having a floating gate adjacent one another and disposed over the second well, wherein the first and second transistors are coupled in series and share a common diffusion region; and
    a control gate disposed over the first well, wherein the control gate is coupled to the floating gate and the control and floating gates comprise the same gate layer extending across the first and the second wells; and
    at least one well contact region disposed in the first well and adjacent to the control gate, wherein the well contact region couples the first well to a control gate line (CGL) and is biased at a bias potential during various operations of the memory cell.

2. The memory cell of claim 1 wherein the first well is of a first polarity type and the second well is of a second polarity type different from the first polarity type.

3. The memory cell of claim 2, wherein the first well is an n-type well and the second well is a p-type well, wherein each of the floating gate and the select gate comprises an n-type metal-oxide-semiconductor (NMOS), and wherein the control gate comprises an n-type capacitor.

4. The memory cell of claim 3, wherein the memory cell is programmable by Fowler-Nordheim (FN) tunneling effect.

5. The memory cell of claim 3, wherein the memory cell is erasable by FN tunneling effect.

6. A non-volatile (NV) multi-time programmable (MTP) memory cell comprising:
    a substrate;
    first and second wells disposed in the substrate, wherein the first well is an n-type well and the second well is a p-type well;
    a first transistor having a select gate and a second transistor having a floating gate adjacent one another and disposed over the second well and sharing a common diffusion region; and
    a control gate disposed over the first well, wherein the control gate is coupled to the floating gate and the control and floating gates comprise the same gate layer extending across the first and the second wells, and wherein
        each of the floating gate and the select gate comprises an n-type metal-oxide-semiconductor (NMOS), and the control gate comprises an n-type capacitor,
        an area ratio between the control gate and the floating gate is 0.8:0.2, a ratio of width and length of the floating gate is 0.4:0.28, and a ratio of width and length of the control gate is 1.6:0.84.

7. The memory cell of claim 3 comprising a plurality of contacts surrounding the control gate, wherein the plurality of contacts are coupled to the first well of the control gate.

8. The memory cell of claim 1 wherein the first and second wells comprise the same polarity type.

9. The memory cell of claim 8, wherein the first well is an n-type well and the second well is an n-type well, wherein each of the floating gate and the select gate comprises a p-type metal-oxide-semiconductor (PMOS), and wherein the control gate comprises a p-type capacitor.

10. The memory cell of claim 9, wherein the floating gate is doped with p-type dopants.

11. The memory cell of claim 9, wherein the memory cell is programmable by band-to-band tunneling induced hot electron (BTBTHE) injection.

12. The memory cell of claim 9, wherein the memory cell is erasable by FN tunneling effect.

13. The memory cell of claim 8, wherein the first well is an n-type well and the second well is an n-type well, wherein each of the floating gate and the select gate comprises a p-type metal-oxide-semiconductor (PMOS), and wherein the control gate comprises an n-type capacitor.

14. The memory cell of claim 13, wherein the floating gate is doped with n-type dopants.

15. The memory cell of claim 1 comprising:
    a third well disposed in the substrate; and
    an erase gate disposed over the third well, wherein the control, floating and erase gates are commonly coupled and the control, floating and erase gates comprise the same gate layer extending across the first, second and third wells.

16. The memory cell of claim 15, wherein each of the first and the third wells is a p-type well and wherein the second well is an n-type well.

17. The memory cell of claim 16, wherein each of the floating gate and the select gate comprises a p-type metal-oxide-semiconductor (PMOS).

18. The memory cell of claim 17, wherein each of the control gate and the erase gate comprises a p-type capacitor.

19. A non-volatile (NV) multi-time programmable (MTP) memory cell comprising:
    a substrate;
    first and second wells disposed in the substrate;
    a first transistor having a select gate and a second transistor having a floating gate adjacent one another and disposed over the second well; and
    a control gate disposed over the first well, wherein the control gate is coupled to the floating gate and the control and floating gates comprise the same gate layer extending across the first and second wells, and
    wherein a ratio of width and length of the floating gate is 0.4:0.28, and wherein a ratio of width and length of the control gate is 1.6:0.84.

20. The memory cell of claim 19 comprising:
    a third well disposed in the substrate; and
    an erase gate disposed over the third well, wherein the control, floating and erase gates are commonly coupled.

21. The memory cell of claim 1 wherein the memory cell is configured to operate in two types of programming modes or two types of erase modes.

22. The memory cell of claim 1 wherein:
    the first transistor comprises first and second diffusion regions and the second transistor comprises first and second diffusion regions;
    the second diffusion regions of the first and second transistors correspond to the common diffusion region;
    the first diffusion region of the first transistor is coupled to a bitline while the first diffusion region of the second transistor is coupled to a source line of the memory cell; and the well contact region coupled to the CGL is biased at a positive programming potential (+$V_{prog}$) during programming of the memory cell.

* * * * *